United States Patent
Richard et al.

(10) Patent No.: US 10,256,204 B2
(45) Date of Patent: Apr. 9, 2019

(54) SEPARATION OF INTEGRATED CIRCUIT STRUCTURE FROM ADJACENT CHIP

(71) Applicant: GLOBALFOUNDRIES Inc., Grand Cayman (KY)

(72) Inventors: Glen E Richard, Burlington, VT (US); Stephen P Ayotte, New Haven, VT (US); Hanyi Ding, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/345,608

(22) Filed: Nov. 8, 2016

(65) Prior Publication Data

US 2018/0130733 A1 May 10, 2018

(51) Int. Cl.
*H01L 23/498* (2006.01)
*H01L 23/00* (2006.01)
*H01L 23/34* (2006.01)

(52) U.S. Cl.
CPC ............ *H01L 24/11* (2013.01); *H01L 23/345* (2013.01); *H01L 24/05* (2013.01); *H01L 2224/0401* (2013.01)

(58) Field of Classification Search
None
See application file for complete search history.

(56) References Cited

U.S. PATENT DOCUMENTS

| 4,444,559 | A | 4/1984 | Schink et al. |
| 5,498,850 | A | 3/1996 | Das |
| 5,542,601 | A | 8/1996 | Fallon et al. |
| 2014/0376202 | A1* | 12/2014 | Shibutani .......... H01L 23/49811 361/767 |
| 2018/0019266 | A1* | 1/2018 | Yamazaki ............ H01L 27/124 |

* cited by examiner

*Primary Examiner* — Long Pham
(74) *Attorney, Agent, or Firm* — Anthony Canale; Hoffman Warnick LLC (57) ABSTRACT

Embodiments of the present disclosure relate to separating an integrated circuit (IC) structure from an adjacent chip. An IC structure according to embodiments of the disclosure may include: a semiconductor region including an interconnect pad positioned thereon, the interconnect pad electrically connected to a solder bump; and an ohmic heating wire positioned within the semiconductor region and in thermal communication with the interconnect pad, wherein the ohmic heating wire is configured to be heated above a melting temperature of the solder bump.

10 Claims, 9 Drawing Sheets

SEPARATION OF INTEGRATED CIRCUIT STRUCTURE FROM ADJACENT CHIP

BACKGROUND

Technical Field

The present disclosure relates to the separation of integrated circuit (IC) structures from adjacent IC chips. In particular, embodiments of the present disclosure include structures and methods for separating an IC structure from an adjacent IC chip, which may be mechanically and electrically connected to the IC structure through one or more solder bumps.

Related Art

Each IC can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of gate materials (e.g., a polysilicon gates) for a transistor structure. A group of vertically-extending conductive contacts can provide electrical connections to the transistor from other functional elements of a circuit. BEOL generally includes fabrication processes following the formation of materials in FEOL processing, including the formation of all metal levels in the structure. Each metal level can include metal wires therein, which can be connected to other metal levels through vertically-oriented conducting wires known as vias. In conventional BEOL processing, a layer of vias is formed to connect devices in an IC structure to a layer of metal wires formed on top of the vias, with a successive layer of vias formed thereon, followed by another layer of metal wires, etc. To provide greater scaling and sophistication of the fabricated device, the number of metal levels can be varied to suit a particular application, e.g., by providing four to six metal levels, or as many as, in a further example, sixteen or more metal levels.

In flip chip processing of semiconductor integrated circuit (IC) chips, solder bumps such as controlled collapse chip connect (C4) solder balls can be implemented to connect IC dies to packaging and/or to each other. When formed, each solder bump can provide an electrically conductive structure coupled between directly connected IC chips to serve as a mechanical and electrical connection between the two chips. Following the manufacture of a product, a user may wish to separate individual IC chips from each other, e.g., for modification, repair, etc. To separate the variously connected IC chips, a user must sever each solder bump connection between connected IC chips before the chips can be moved apart. Purely mechanical separation of the joined chips may not be desired due to the risk of mechanical damage or separation of operative components included in each IC chip when the chips are separated. Conventional techniques for separating two IC chips from each other may include the use of external devices or other tools for applying heat to melt the various solder bumps. Such techniques, however, may also cause the heating or melting of other components in addition to the targeted solder bumps. In some cases, conventional techniques may induce localized heating of organic components in an assembly including IC structures. Localized heating of such components may contribute to other structural concerns, e.g., thermal aging and negative effects on performance.

SUMMARY

A first aspect of the disclosure provides an integrated circuit (IC) structure including: a semiconductor region including an interconnect pad positioned thereon, the interconnect pad electrically connected to a solder bump; and an ohmic heating wire positioned within the semiconductor region and in thermal communication with the interconnect pad, wherein the ohmic heating wire is configured to be heated above a melting temperature of the solder bump.

A second aspect of the disclosure provides an integrated circuit (IC) structure, including: an insulator positioned over a semiconductor region; an interconnect pad positioned within the insulator, wherein the interconnect pad is electrically connected to a solder bump; and an ohmic heating wire positioned within the insulator and in thermal communication with the interconnect pad, wherein the ohmic heating wire is configured to be heated above a melting temperature of the solder bump.

A third aspect of the disclosure provides a method of separating an integrated circuit (IC) structure from an adjacent IC chip, the method including: providing a structure including: an IC chip including an interconnect pad positioned proximal to a surface thereof, the interconnect pad mechanically coupling the IC chip to the adjacent IC chip through a solder bump positioned on the interconnect pad, and an ohmic heating wire positioned within the IC chip and in thermal communication with the interconnect pad; melting the solder bump by passing an electrical current through the ohmic heating wire; and separating the IC chip from the adjacent IC chip after melting the solder bump.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Embodiments of the present disclosure provide an integrated circuit (IC) structure for separating interconnected and adjacent IC chips, e.g., by melting a set of solder bumps which connect the IC structures together. Embodiments of the present disclosure also include methods for separating an IC structure from an adjacent IC chip by melting a solder bump which connects the IC structures together, e.g., using an ohmic heating wire formed within the structure. It is understood that embodiments of the present disclosure also include other structures and/or methods for addressing various technical challenges. An IC structure according to the present disclosure may include a semiconductor region with one or more interconnect pads positioned thereon. Each interconnect pad of the structure may be electrically connected to a respective solder bump. An ohmic heating wire may be positioned within the semiconductor region and in thermal communication with the interconnect pad, such that thermal energy in the ohmic heating wire may transfer to the interconnect pad. The ohmic heating wire may be fabricated, structured, etc., to be heated above the solder bump's melting temperature.

The present disclosure includes methods of separating an IC structure from an adjacent IC chip. During operation, a user can melt a solder bump by transmitting an electric current through the ohmic heating wire to raise its temperature above the melting point of the solder bump. Structures according to the present disclosure can allow heat to be transferred from the ohmic heating wire to the solder bump in order to melt the solder bump. The IC structure can be physically separated from one or more adjacent IC chips after respective solder bumps connecting the IC structure to the adjacent IC chips have melted. Among other advantages, embodiments of the present disclosure can allow a user to melt one or more solder bumps together (e.g., all bumps in a single plane) solely through the use of ohmic heating wires, and without applying heat from sources outside the IC structure.

Figure 1:
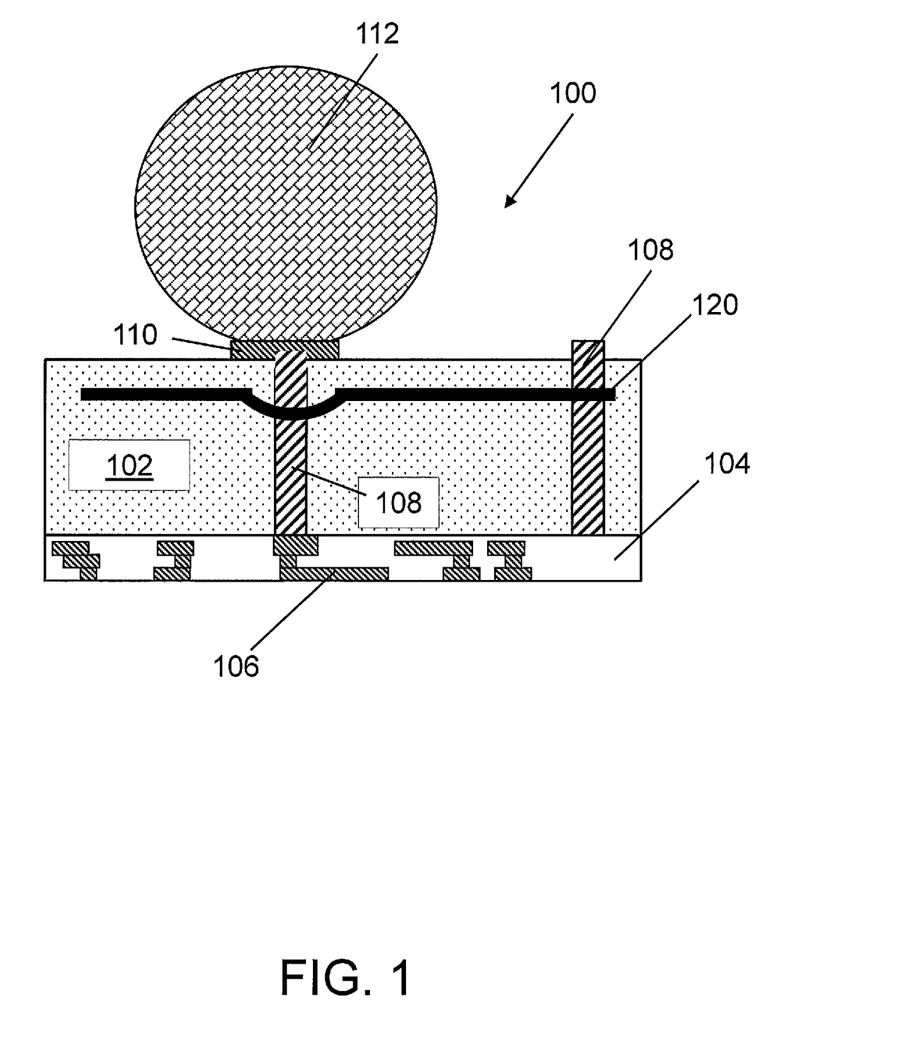
FIG. 1 shows a cross-sectional view of an integrated circuit (IC) structure according to embodiments of the present disclosure.

Referring to FIG. 1, an IC structure 100 is shown according to embodiments of the disclosure. IC structure 100 can include a semiconductor region 102 composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of semiconductor region 102 or a portion thereof may be strained.

Semiconductor region 102 can be positioned over a region of insulator material 104, which can be subdivided into a group of layers providing different amounts of electrical insulation. The insulating quality of a material may be characterized by "k," the dielectric constant. For example, insulator material 104 may be composed of any insulating material such as $SiO_2$ or a "high-k" dielectric having a high dielectric constant (where "k" denotes the material's dielectric constant), which may be, for example, above 3.9. In some situations, insulator material 104 may be composed of an oxide substance. Insulator material 104 can initially be formed as a single, continuous layer or group of insulating layers, each of which can be separately processed to include trenches, cavities, etc. Materials appropriate for the composition of insulator material 104 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties. As is known in the art, the properties of insulator material 104, including the magnitude of each layer's dielectric constant for each layer, can allow for different types of layers to serve as, e.g., a "high-k" layer, a "low-k" layer, an "ultra low-k" layer, etc. Insulator material 104 can include a plurality of metal wires 106 therein for providing electrical connections between, e.g., IC structures discussed herein and other IC devices.

One or more through-semiconductor vias (TSVs, also known as through-silicon vias) 108 may be embedded within semiconductor region 102. As known in the art, a TSV may refer to an electrically conductive via etched through a substrate or semiconductor "wafer" to provide a wafer-to-wafer interconnect scheme compatible with 3D wafer-level packaging, e.g., electrical connections which use solder bumps formed on an upper surface of substrate or semiconductor material. Each TSV 108 can be used to connect metal wires 106 to other components. TSV(s) 108 can include substantially annular refractive liners (not shown) disposed circumferentially about their structure for providing additional electrical insulation and for preventing electromigration between TSV(s) 108 and adjacent structures. Such liners can be composed of any currently known or later developed conductive material, e.g., refractory metals such as ruthenium (Ru), tantalum (Ta), titanium (Ti), tungsten (W), iridium (Ir), rhodium (Rh) and platinum (Pt), etc., or mixtures of thereof. In a particular embodiment, one or more TSVs 108 within semiconductor region 102 can be embodied as a power supply TSV for transmitting larger amounts of current than other TSVs. One or more power supply TSVs can be fabricated in the form of, e.g., a substantially annular TSV, optionally including a semiconductor pillar positioned therein, and positioned substantially in parallel with an axial center of TSV 108. As is shown in FIG. 1, each TSV can extend substantially vertically through semiconductor region 102 between two axial ends. Although TSVs 108 are shown to exhibit a substantially columnar shape in the accompanying FIGS., TSVs 108 may have different structures in further embodiments. More generally, TSVs 108 may have any desired shape or size, and may include, e.g., one or more electrically connected members which may each have linear profiles, curvilinear profiles, wave-type profiles, irregular profiles, etc.

Structure 100 may also include an interconnect pad 110 positioned over and in contact with semiconductor region 102. Interconnect pad 110 can be composed of a conductive material, such as a metal or combination of metals, and can be formed, e.g., by any currently known or later developed deposition process as described herein. As used herein, "deposition" or "depositing" a material (e.g., interconnect pad 110) may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed. Interconnect pad 110 can be formed over TSV 108 at a predetermined area of semiconductor region 102. Interconnect pad 110 may be connected to one or more metal wires 106, e.g., through TSV 108. A solder bump 112 can be formed over and in contact with interconnect pad 110. During operation, interconnect pad 110 can include or otherwise serve as ball-limiting metallurgy (BLM) layer for limiting the size of solder bumps 112 formed on TSV(s) 108 of structure 100. Specifically, BLM materials refer to solder-wettable metals which define the size and area of a soldered connection, e.g., between C4 solder bumps and a chip. BLM metals can include, e.g., one or more of the refractory metals discussed herein. BLM metals can limit the flow of a formed solder bump to the area covered by BLM metal, thereby providing adhesion and contact to the formed wiring.

Structure 100 can include a solder bump 112 composed of, e.g., any currently known or later developed solderable material. Solder bump 112 may be formed from, e.g., material having tin and lead, tin without lead, tin with a residual of copper or silver, tin bismuth, tin indium, etc. The size of solder bump 112 can be determined at least in part by the size (e.g., surface area, depth, etc.) of interconnect pad 110. For example, where multiple interconnect pads 110 are formed on semiconductor region 102 and with different sizes, each solder bump 112 can similarly be of a different size to accommodate varying current carrying capacity and/or spacing requirements of IC structure 100. In any case, solder bump 112 may be electrically connected to interconnect pad 110 by virtue of being positioned thereon, such that interconnect pad 110 electrically couples solder bump 112 to one or more TSVs 108.

Figure 2:
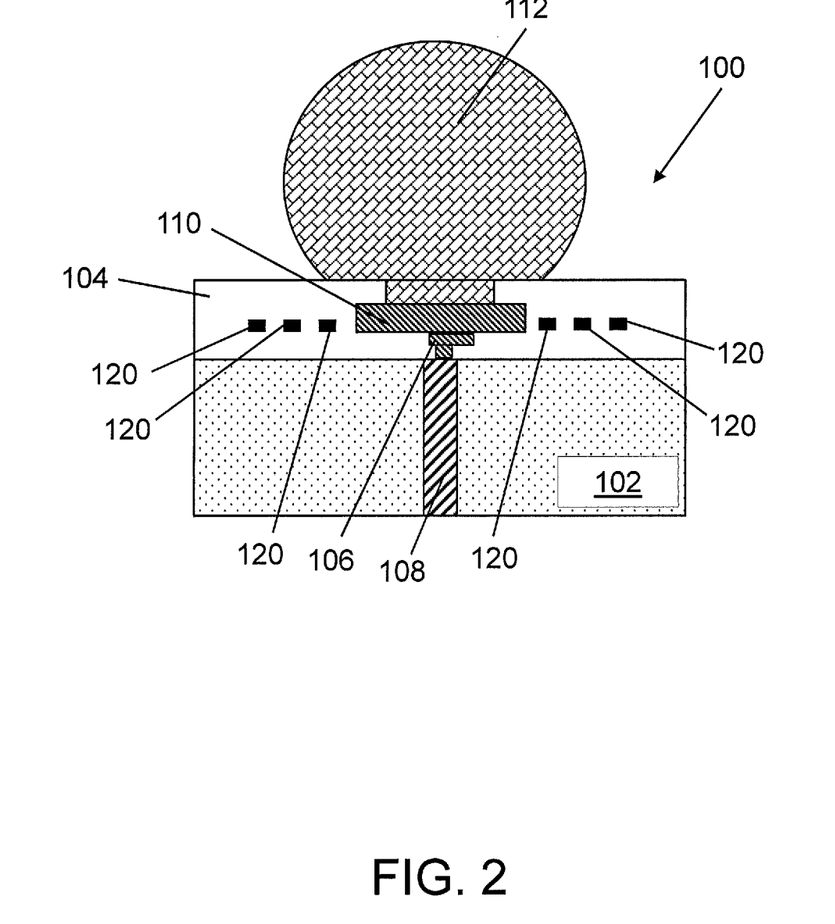
FIG. 2 shows a cross-sectional view of an IC structure according to further embodiments of the present disclosure.

Turning to FIG. 2, further embodiments of the present disclosure can include further embodiments of structure 100. The various features and components of structure 100 discussed with respect to FIG. 2 may be used in conjunction with and/or alternatively to embodiments described elsewhere herein relative to other FIGS., except where noted specifically herein. Structure 100 can include insulator 104 positioned over semiconductor region 102, with one or more interconnect pads 110 being positioned within insulator 104. Interconnect pad 110 may be connected to solder bump 112 as discussed elsewhere herein. However, interconnect pad 110 and solder bump 112 may be structured as a "front side" interconnect component in contrast to interconnect pad 110 and solder bump 112 illustrated in FIG. 1, which may provide a "back side" interconnect component. Ohmic heating wire 120 may also be positioned within insulator 104 and in thermal communication with interconnect pad 110. As discussed elsewhere herein, ohmic heating wire 120 may have a structure and composition configured to withstand being heated above a melting temperature of solder bump 112. Insulator 104 may include multiple metal wires 106 as described herein, e.g., to form an electrical connection between interconnect pad 110 and other components. In some cases, one or more TSV(s) 108 may be positioned within semiconductor region 102. However, TSV 108 may be absent from structure 100 where solder bump 112 provides a "front side" interconnect component to an IC. As shown in FIG. 2, ohmic heating wire(s) 120 may be substantially coplanar with interconnect pad 110, e.g., to facilitate transfer of heat from ohmic heating wire(s) 120 to interconnect pad 110. However, it is understood that one or more ohmic heating wire(s) 120 may not be provided in a planar arrangement relative to interconnect pad 110. Although two embodiments are shown in FIGS. 1 and 2, respectively, it is understood that some embodiments of structure 100 may include solder bumps 112 positioned on front and back sides of an IC. The various components and arrangements shown in FIGS. 1 and 2 may be combined or used together, where appropriate, in such implementations.

Figure 3:
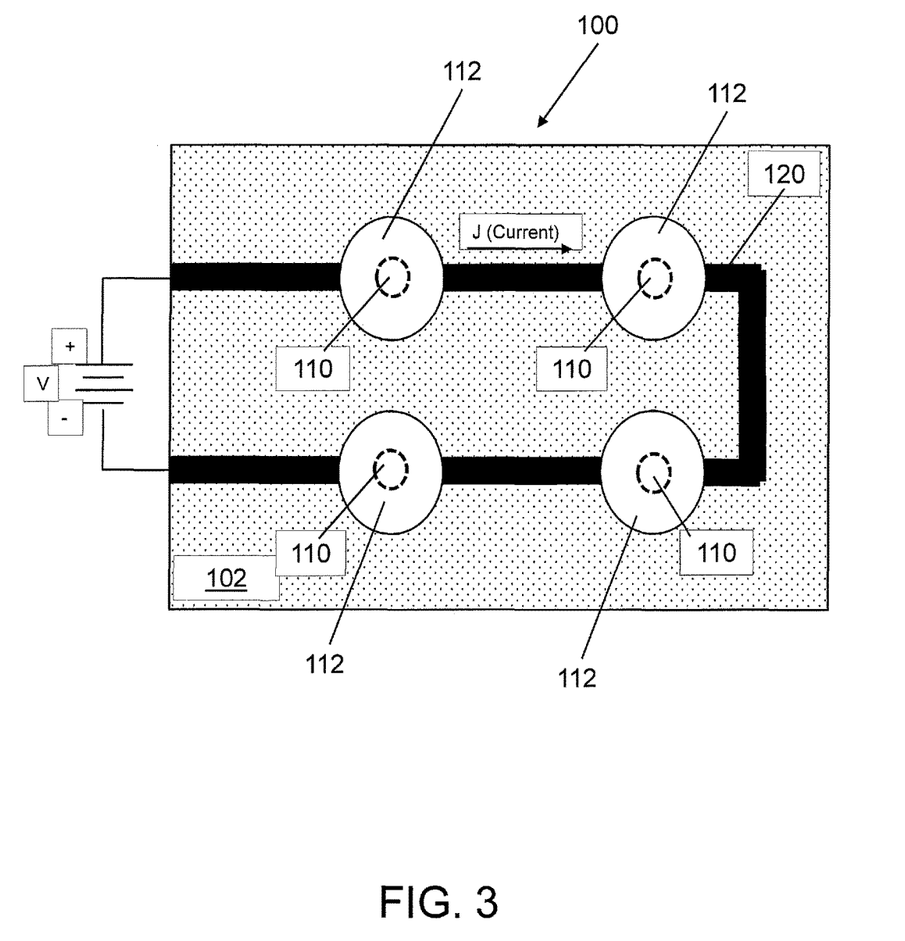
FIG. 3 shows a plan view of an IC structure according to embodiments of the present disclosure.

Referring to FIGS. 1-3 together, structure 100 can include one or more ohmic heating wires 120 positioned within semiconductor region 102 and/or insulator 104, and physically proximate interconnect pad(s) 110 (shown in phantom in FIG. 3). FIGS. 1 and 3 show a single ohmic heating wire 120 for the purposes of demonstration, but structure 100 may include multiple ohmic heating wires 120 as shown in FIG. 2 and/or noted elsewhere herein. Ohmic heating wire 120 may be structured to laterally circumvent one or more TSVs 108 (FIG. 1 only), or may be electrically connected thereto. Ohmic heating wire 120 may include multiple sub-portions each connected to each other through any currently known or later-developed conductive metal or metal-based substance. For example, portions of ohmic heating wire 120 may include, e.g., copper (Cu), aluminum (Al), etc., such that ohmic heating wire 120 includes multiple sub-components or regions with different material compositions and/or properties. Thus, ohmic heating wire 120 may represent part of a larger circuit or electrical structure with different portions, regions, etc., for providing different operational properties.

Ohmic heating wire 120 may be at least partially formed from one or more resistive metals capable of remaining solid or otherwise structurally stable at temperatures above the melting point of solder bump(s) 112. For instance, ohmic heating wire 120 may be composed of any currently known or later-developed resistive metal substance, e.g., tungsten (W), tantalum nitride (TaN), nichrome (NiCr), etc. As used herein, a "resistive metal" refers to a metal element or compound capable of transmitting electric currents, but with a higher resistivity relative to the material composition of conventional wires (e.g., aluminum, copper, etc.). Ohmic heating wire 120 may also include one or more resistive metal alloys, e.g., Manganin (i.e., an alloy including copper, manganese, and nickel), Brightray (i.e., one or more alloys including nickel and chromium), and/or other resistive metal alloys which may include the various substances discussed herein and/or other non-metal materials such as carbon (C). However embodied, ohmic heating wire 120 may exhibit a melting point higher than the material composition of solder bump 112 so as to resist material degradation at elevated temperatures. In addition to having a higher melting point than solder bump 112, ohmic heating wire 120 may have a greater resistivity than other conductive metals, such that electric current J transmitted through ohmic heating wire 120 will generate heat to increase the temperature of ohmic heating wire 120.

As noted herein, embodiments of the present disclosure include methods for separating structure 100 from adjacent IC chips (e.g., other structures 100 coupled to structure 100 through solder bump(s) 112). During operation, a user may increase the temperature of ohmic heating wire 120 above the melting point of solder bump 112, e.g., by passing electrical current J therethrough. According to an example, the process of melting solder bump 112 can include heating ohmic heating wire 120 to a temperature of at least approximately 180 degrees Celsius (° C.) with electrical current J, e.g., over a predetermined time. According to a further example, a user may apply electrical current J to ohmic heating wire 120 for period of between approximately six seconds and approximately twenty seconds. Electrical current J can be applied to ohmic heating wire 120 by way of a voltage source V (FIG. 3 only), e.g., one or more batteries. Voltage source V may be external to structure 100, but it is understood that voltage source V may be located within structure 100 in alternative embodiments. Where ohmic heating wire 120 is coupled to one or more TSVs 108, one or more voltage sources may be coupled to TSV(s) 108 to apply electrical current to ohmic heating wire 120.

As shown, ohmic heating wire 120 can be located proximal to interconnect pad 110 and, optionally, TSV(s) 108. In this arrangement, only semiconductor region 102 may separate ohmic heating wire 120 from interconnect pad 110 and/or TSV(s) 108. Where ohmic heating wire 120 is in thermal communication with multiple interconnect pads 110, methods of separating structure 100 from other IC chips can include, e.g., melting several solder bumps 112 by transmitting heat from ohmic heating wire 120 to several interconnect pads 110 each positioned beneath respective solder bumps 112.

In an embodiment, the physical displacement between ohmic heating wire 120 and interconnect pad(s) 110 (shown in phantom in FIG. 3) may be no more than, e.g., twenty micrometers (μm), and in some cases may be approximately fifteen μm, ten μm, five μm, less than one μm, etc. When ohmic heating wire 120 is heated to an elevated temperature, thermal energy may dissipate through semiconductor region 102 to reach interconnect pad 110, and TSV(s) 108 where applicable. Where TSV 108 (FIG. 1 only) is heated by ohmic heating wire 120, TSV 108 can thermally conduct heat to also raise the temperature of interconnect pad(s) 110 connected thereto. In any event, such thermal transmission can raise the temperature of solder bump 112 above its melting point. After solder bump(s) 112 of structure 100 have been melted, structure 100 can be physically separated (e.g., exfoliated) from adjacent IC chips (not shown) without being physically opposed by solid solder bump(s) 112. The presence of ohmic heating wire 120 in structure 100 can thereby allow a user to melt solder bump(s) 112 by applying electric current J to ohmic heating wire 120, and without applying heat from heat sources outside structure 100.

Figure 4:
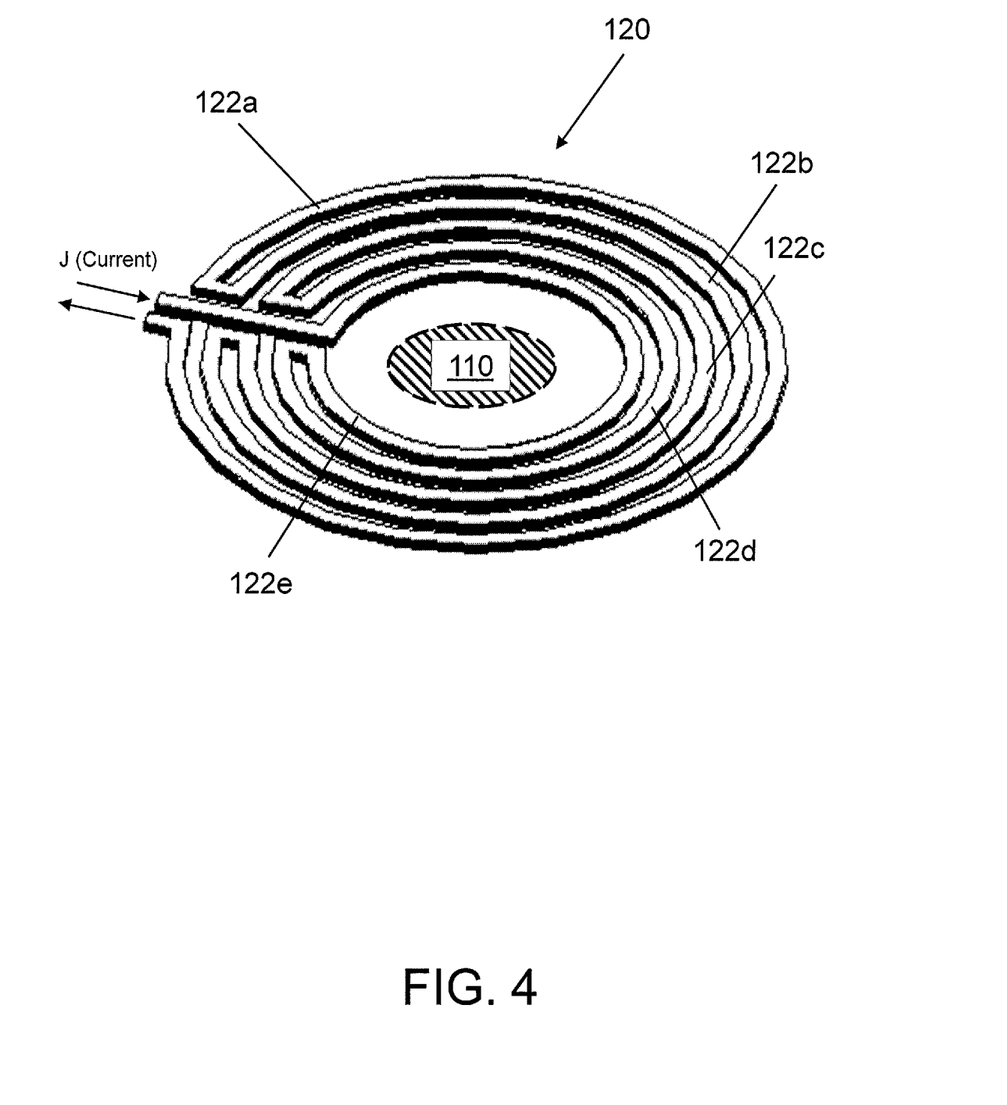
FIG. 4 shows a perspective view of an ohmic heating wire with multiple loops according to embodiments of the present disclosure.

Turning to FIG. 4, an embodiment of ohmic heating wire 120 with multiple loops 122 positioned proximal to and substantially circumferentially about interconnect pad 110 (shown in phantom). Ohmic heating wire 120 may be formed to include one or more loops 122 which circumvent respective TSV(s) 108 (FIGS. 1-2) and/or interconnect pads 110. Ohmic heating wire 120, as depicted in FIG. 4, may be positioned within semiconductor region 102 (FIGS. 1-2) or insulator 104 (FIGS. 1-2) as discussed herein. Only interconnect pad 110 is shown in FIG. 4 for the purposes of example, but it is understood that a portion of TSV 108 may be positioned circumferentially inward of ohmic heating wire 120 in further embodiments. As shown, ohmic heating wire 120 with loops 122 may not be electrically connected to TSV(s) 108 and/or interconnect pad(s) 110. Ohmic heating wire 120 may include any number of loops, and is shown by example to include five loops 122a, 122b, 122c, 122d, 122e, respectively. Each loop 122 may be in thermal communication with TSV(s) 108 and/or interconnect pad(s) 110, e.g., to provide increased heat transfer from ohmic heating wire 120. Electrical current J may travel through each loop 122 ohmic heating wire 120 before continuing to further portions of ohmic heating wire 120 and/or other components, as shown.

Figure 5:
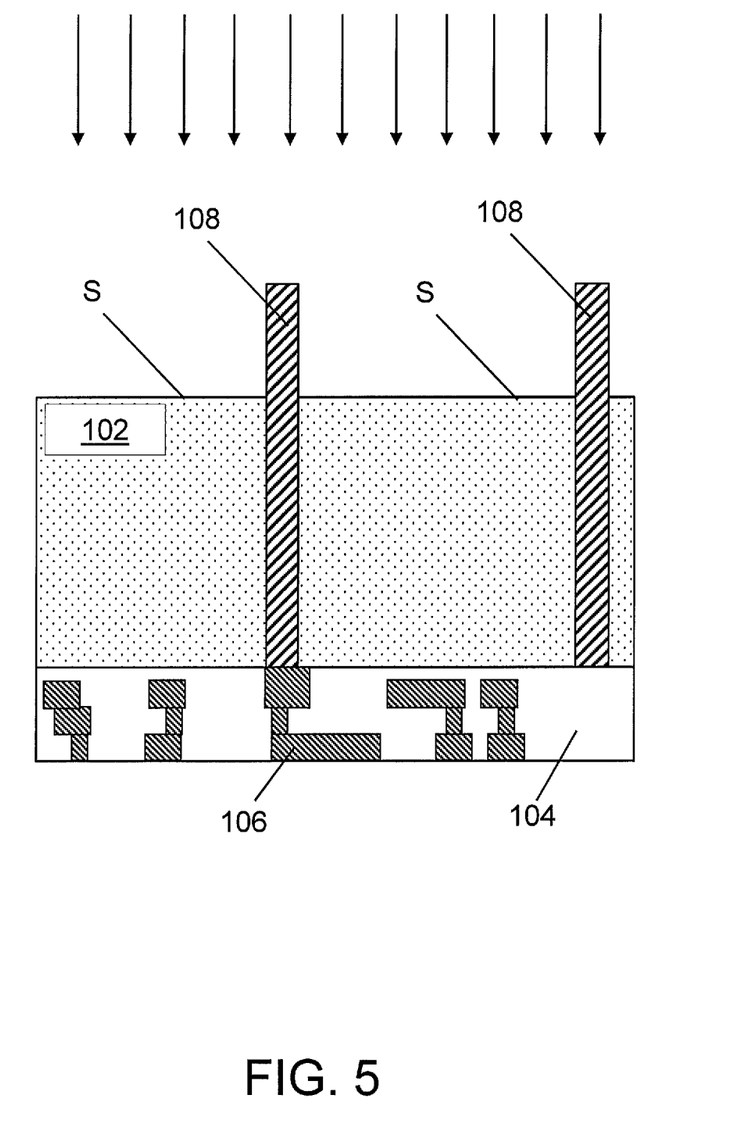
FIG. 5 shows a cross-sectional view of a structure to be processed according to embodiments of the present disclosure.

Referring to FIG. 5, structure 100 can be formed with few modifications to conventional processes of forming semiconductor region 102, insulator 104 TSV(s) 108, and components connected thereto. Furthermore, existing structures may be modified to incorporate ohmic heating wire(s) 120 (FIGS. 1-3) as discussed herein. As such, structure 100 can be formed to include ohmic heating wire(s) 120 in a variety of locations to suit user and/or technical preferences. Initially, portions of semiconductor region 102 may be removed (e.g., by backside grinding, etching, and/or other processes for removing a material) to expose an end and, optionally, one or more sidewall(s) of TSV(s) 108 extending through semiconductor region 102. Removing portions of semiconductor region 102 can expose a surface S of semiconductor region 102, where additional components may be formed as discussed herein. It is understood that the various processes described herein may be modified to yield further embodiments described herein, e.g., structure 100 shown in FIG. 2.

Figure 6:
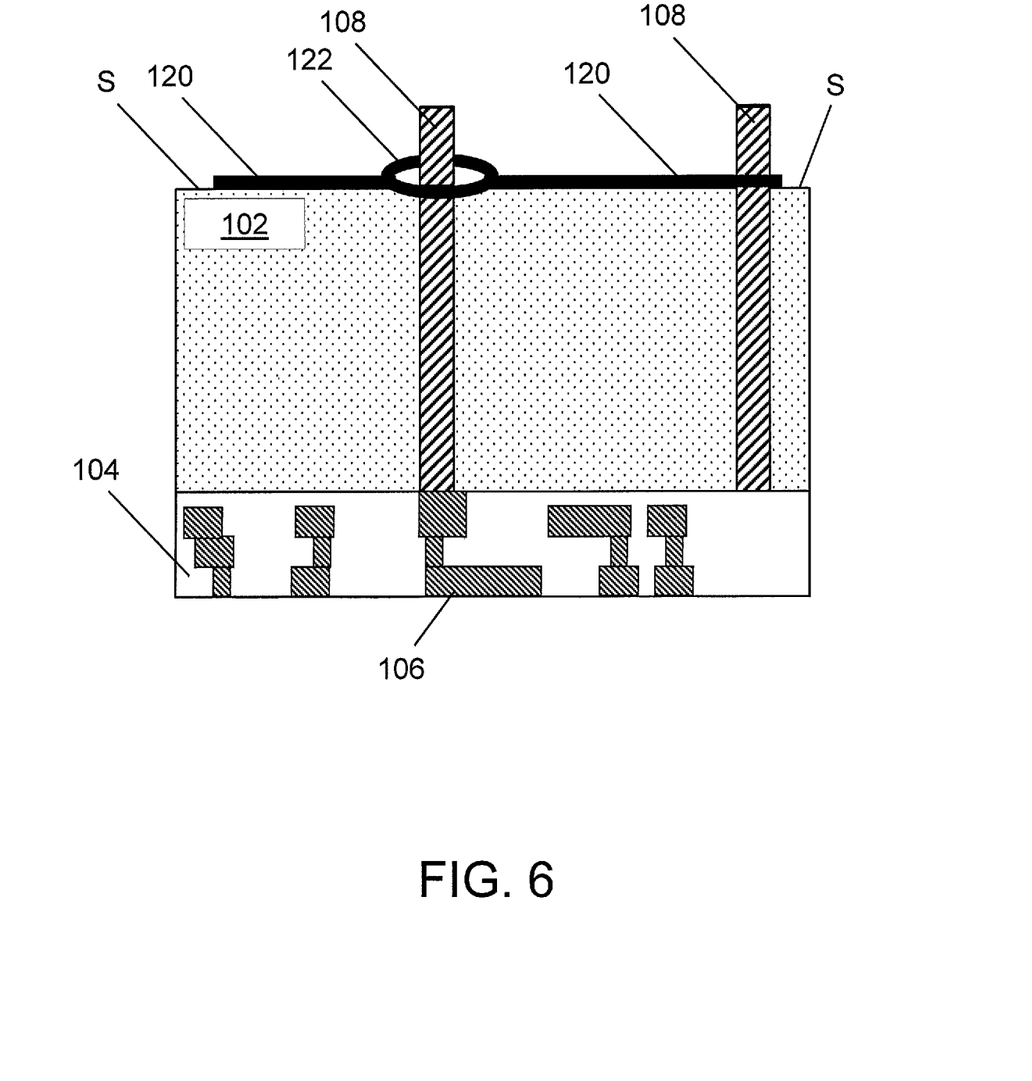
FIG. 6 shows a cross-sectional view of an ohmic heating wire being formed according to embodiments of the present disclosure.

Turning to FIG. 6, ohmic heating wire 120 can be formed, e.g., by depositing one or more layers of resistive metal (e.g., TaN, NiCr, etc., as described elsewhere herein) on surface S of semiconductor region 102, or a partially formed insulator 104 in further embodiments. To avoid forming ohmic heating wire 120 on some TSV(s) 108, resistive metal may be formed only on semiconductor region 102 through a selective deposition process, or portions of surface S may be covered by a masking material to form ohmic heating wire 120 in a desired shape. In some cases, as shown in FIG. 6, ohmic heating wire 120 may laterally abut one or more TSV(s) 108 to form an electrical connection thereto. Ohmic heating wire 120 may also be formed to include one or more loops 122 as discussed elsewhere herein. By forming ohmic heating wire 120 only in selected locations, a user may control whether ohmic heating wire 120 is electrically connected or disconnected to particular TSV(s) 108 in a structure.

Figure 7:
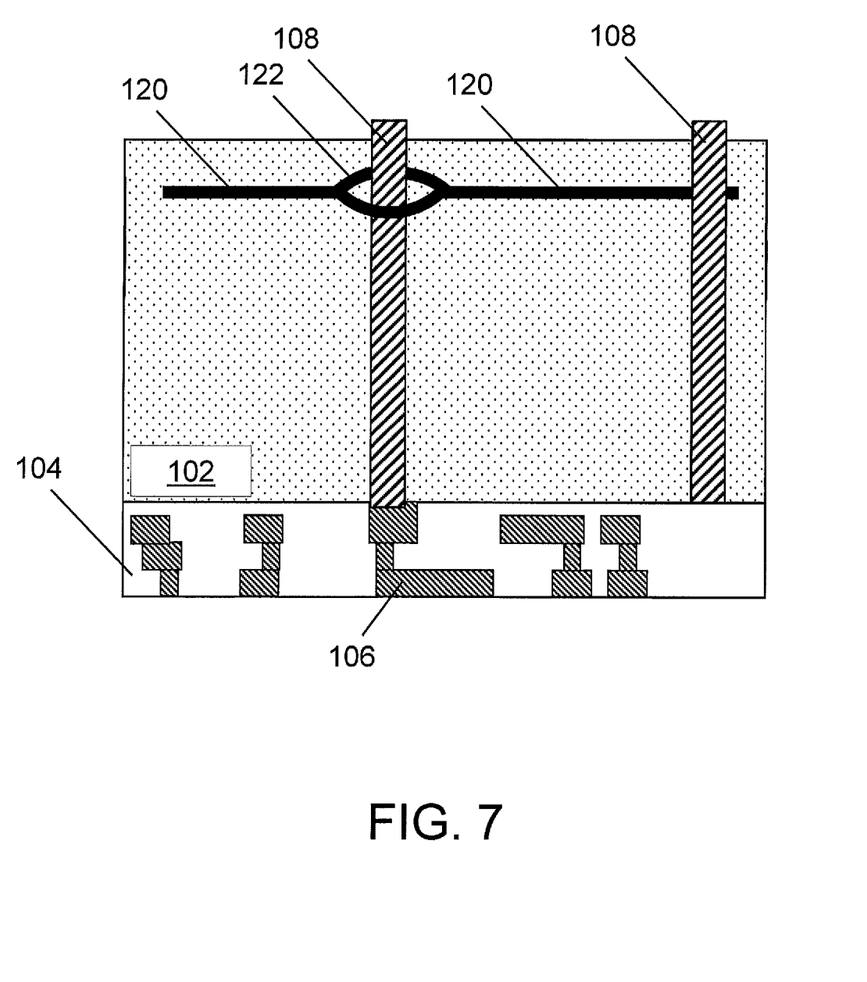
FIG. 7 shows a cross-sectional view of an ohmic heating wire being covered with semiconductor material according to embodiments of the present disclosure.

Turning to FIG. 7, further processes can include embedding ohmic heating wire(s) 120 within semiconductor region 102 (and/or insulator 104, where applicable) to provide electrical insulation between ohmic heating wire(s) 120 and laterally separated components. As discussed herein, semiconductor region 102 between ohmic heating wire(s) 120 and TSV(s) 108 or interconnect pad 110 may have a thickness of less than approximately twenty μm to retain thermal communication therebetween. As shown, additional semiconductor material can be formed on semiconductor region 102, TSV(s) 108, and/or ohmic heating wire(s) 120 (e.g., by deposition) to increase the size of semiconductor region 102. After forming additional semiconductor material, ohmic heating wire(s) 120 can become embedded within semiconductor region 102 and/or insulator 104 to a desired depth, e.g., up to approximately twenty μm. After being formed on ohmic heating wire 120, semiconductor region 102 may electrically insulate ohmic heating wire 120 from some TSVs 108 and other components formed on semiconductor region 102 (e.g., interconnect pads 110 (FIGS. 1-3), solder bumps 112 (FIGS. 1-3), etc.).

Figure 8:
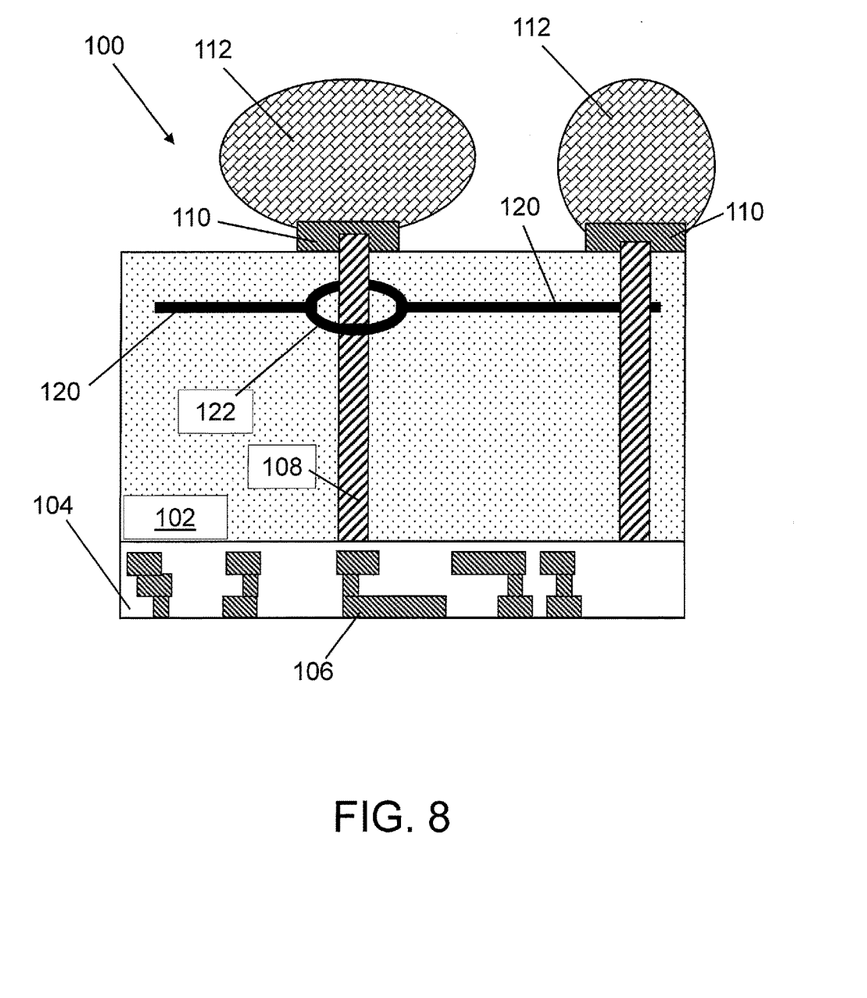
FIG. 8 shows a cross-sectional view of an interconnect pad and solder bump being formed according to embodiments of the present disclosure.

Turning to FIG. 8, the various components of FIG. 7 may be further processed into an embodiment of structure 100, discussed elsewhere herein. For example, interconnect pad(s) 110 can be formed over respective TSV(s) 108. Thereafter, solder bump(s) 112 can be formed on respective interconnect pad(s) 110 through any currently-known or later developed process of forming such components on semiconductor region 102 and TSV(s) 108. As a result of forming ohmic heating wire 120 within semiconductor region 102 and/or insulator 104, ohmic heating wire 120 may be structurally and electrically separated from interconnect pad(s) 110 and some TSV(s) 108, despite being in thermal communication with interconnect pad(s) 110 and TSV(s) 108.

As shown, structure 100 may include one or more ohmic heating wires 120 within semiconductor region 102 and/or insulator 104, each of which may be in thermal communication with multiple interconnect pads 110. Ohmic heating wire 120 may be in direct thermal communication with each interconnect pad 110, e.g., by semiconductor region 102 separating each interconnect pad 110 from ohmic heating wire 120 by no more than, e.g., approximately twenty μm. In other cases, ohmic heating wire 120 may be in indirect thermal communication with interconnect pad(s) 110 through TSV(s) 108. For example, where semiconductor region 102 thermally insulates ohmic heating wire 120 from interconnect pad(s) 110, heat may travel from ohmic heating wire 120 to TSV(s) 108, which in turn may increase the temperature of interconnect pad(s) 110 and solder bumps 112. In some cases, one or more TSVs 108 can deliver current to ohmic heating wire 120 by being electrically connected to ohmic heating wire 120 within semiconductor region 102 and/or insulator 104.

Figure 9:
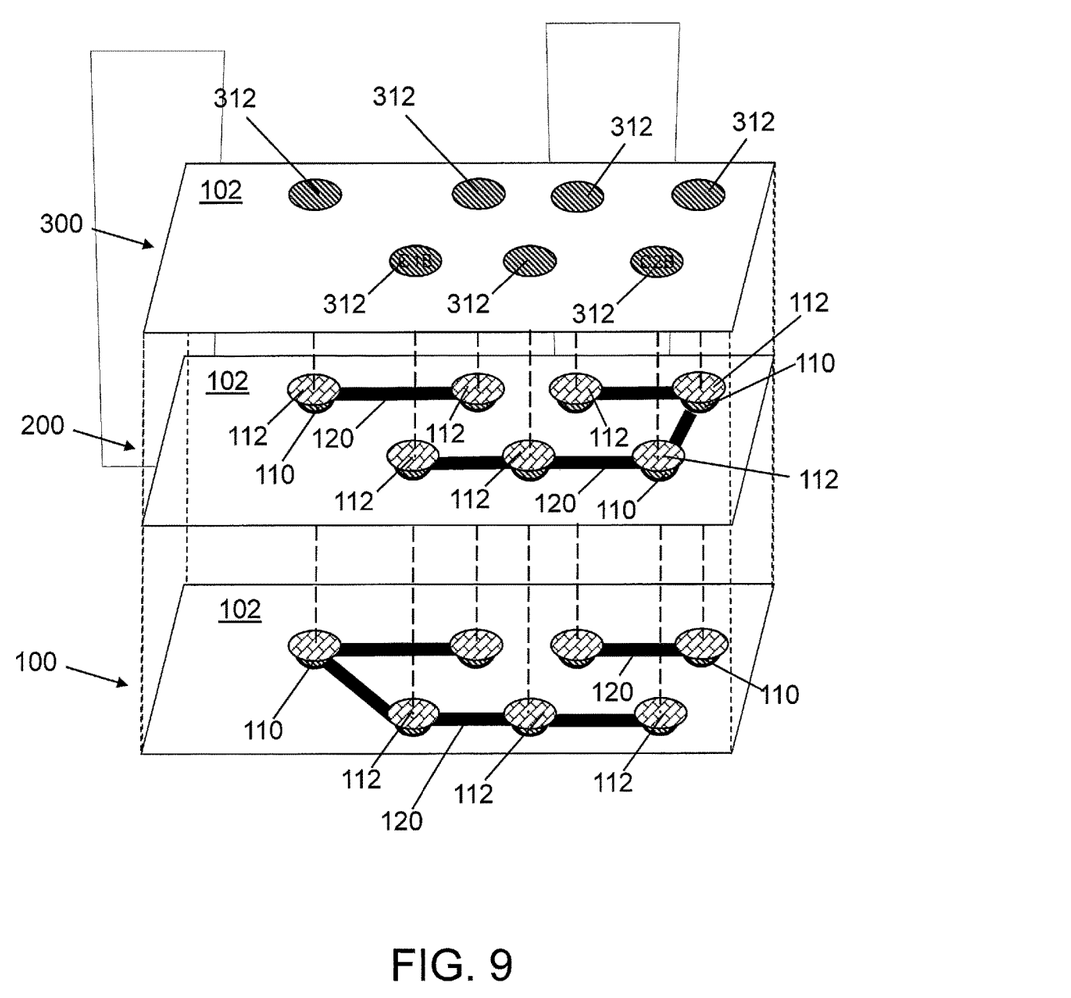
FIG. 9 shows a schematic view of an IC structure and adjacent structures according to embodiments of the present disclosure.

Referring to FIG. 9, a schematic view of structure 100 is shown in the form of an IC unit in conjunction with IC structures 200, 300 according to embodiments of the present disclosure. In the schematic view of FIG. 9, some elements (e.g., insulator material 104, TSVs 108, etc.) are omitted solely for clarity of illustration. Structure 100 can include a plurality of solder bumps 112 each positioned on interconnect pads 110 at respective sites on semiconductor region 102. Each interconnect pad 110 may be in thermal communication with ohmic heating wire 120, e.g., through semiconductor region 102 as discussed elsewhere herein. Each solder bump 112 may mechanically and electrically couple structure 100 to aligned metal wires or contacts (not shown) of structure 200 in the form of, e.g., an adjacent IC chip. Structure 200 may also include, e.g., its own semiconductor region 102, TSV(s) 108 (not shown in FIG. 9), interconnect pads 110, solder bumps 112, ohmic heating wires 120, etc. Similar to structure 100, solder bumps 112 of structure 200 can provide a physical and electrical connection to structure 300 adjacent to structure 200. Structure 300 can include, e.g., a plurality of pins 312 for providing electrical contacts to each solder bump 112 of structure 200. Thus, structures 100, 200 can form parts of a larger device including multiple IC chips therein. Although not shown in FIG. 9, it is understood that structure 100 may also be electrically connected to solder bumps 112 of another IC chip (not shown) located on the opposing side from structure 200.

Each structure 100, 200 may include, e.g., multiple ohmic heating wires 120 therein, each of which may be coupled to one or more solder bumps 112. In some cases, one solder bump 112 may be in thermal communication with multiple ohmic heating wires 120. Each ohmic heating wire 120 may be formed in the same lateral cross-section of semiconductor region 102, or may be positioned within different lateral cross-sections of semiconductor region 102 where applicable. Where multiple ohmic heating wires 120 are included in structure 100, 200, each ohmic heating wire 120 may be one of a plurality of redundant ohmic heating wires 120 to shield structure 100, 200 from electrical shorts, manufacturing errors, damage, etc. More specifically, in the event that one or more ohmic heating wires 120 become disabled, other ohmic heating wires 120 may remain operable to melt solder bumps 112 to separate structure 100, 200 from adjacent structures 100, 200, 300. During operation, a user can melt solder bump(s) 112 of structure(s) 100, 200 by passing an electrical current through at least one of the redundant ohmic heating wires 120. The number of ohmic heating wires 120 and/or redundant ohmic heating wires 120 may be modified based on user preference, manufacturing requirements, etc.

Embodiments of the present disclosure can provide multiple technical and commercial advantages, some of which are discussed by way of example herein. One technical benefit to the structures and processes described herein is the ability to separate individual IC chips from each other by internally melting solder bumps, e.g., to permit modification or servicing components at chip-to-chip, chip-to-packaging, and/or other types of electrical connections. The use of ohmic heating wires in the various structures and methods described herein can provide, e.g., an ability to melt solder bumps without applying heat from sources outside each structure, and instead through the use of electrically-driven internal components. The use of ohmic heating wires to melt solder bumps can also reduce the risk of melting or otherwise modifying components in an IC chip other than solder bumps for linking IC chips together, e.g., metal wires embedded in a layer of insulating material.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a semiconductor region including an interconnect pad positioned on an upper surface thereof, the interconnect pad electrically connected to a solder bump;
   an ohmic heating wire positioned within the semiconductor region and in thermal communication with the interconnect pad;
   a voltage source electrically connected to the ohmic heating wire, and configured to increase a temperature of the ohmic heating wire above a melting temperature of the solder bump; and
   a through-semiconductor via (TSV) positioned within the semiconductor region and electrically connected to the interconnect pad, wherein the semiconductor region is positioned directly between the ohmic heating wire and the TSV, the ohmic heating wire is in thermal communication with the TSV, and the ohmic heating wire has a greater electrical resistance than the TSV.

2. The IC structure of claim 1, wherein the ohmic heating wire comprises one of a resistive metal or a resistive metal alloy.

3. The IC structure of claim 1, wherein the interconnect pad comprises one of a plurality of interconnect pads each positioned within the semiconductor region and electrically connected to a respective solder bump, and wherein the ohmic heating wire is in thermal communication with each of the plurality of interconnect pads.

4. The IC structure of claim 1, wherein the semiconductor region electrically insulates the ohmic heating wire from the interconnect pad.

5. The IC structure of claim 1, wherein the interconnect pad comprises one of a plurality of interconnect pads each positioned on the semiconductor region and electrically connected to a respective through-semiconductor via (TSV), and wherein the ohmic heating wire is in thermal communication with each of the plurality of interconnect pads.

6. The IC structure of claim 1, wherein the ohmic heating wire is electrically connected to a plurality of redundant electrical circuits each configured to transmit a current to the ohmic heating wire.

7. An integrated circuit (IC) structure, comprising:
   a semiconductor region including an interconnect pad positioned on an upper surface thereof, the interconnect pad electrically connected to a solder bump;
   a through-semiconductor via (TSV) extending through the semiconductor region and electrically connected to the interconnect pad;
   an ohmic heating wire positioned within the semiconductor region, laterally circumventing the TSV, and in thermal communication with the TSV through the semiconductor region, wherein the semiconductor region is positioned directly between the ohmic heating wire and the TSV, the ohmic heating wire has a greater electrical resistance than the TSV, and a melting temperature of the ohmic heating wire is greater than a melting temperature of the solder bump; and
   a voltage source electrically connected to the ohmic heating wire, the voltage source configured to heat the ohmic heating wire above the melting temperature of the solder bump.

8. The IC structure of claim 7, wherein the interconnect pad comprises one of a plurality of interconnect pads each positioned within the semiconductor region and electrically connected to one of a plurality of TSVs, and wherein the ohmic heating wire is in thermal communication with each of the plurality of TSVs through the semiconductor region.

9. The IC structure of claim 7, wherein the semiconductor region electrically insulates the ohmic heating wire from the interconnect pad.

10. The IC structure of claim 7, wherein the ohmic heating wire is electrically connected to a plurality of redundant electrical circuits each configured to transmit a current to the ohmic heating wire.

* * * * *